(12) United States Patent
Huang

(10) Patent No.: US 8,018,698 B2
(45) Date of Patent: Sep. 13, 2011

(54) I/O CIRCUIT WITH ESD PROTECTING FUNCTION

(75) Inventor: Chao-Sheng Huang, Taipei (TW)

(73) Assignee: Via Technologies, Inc., Taipei (TW)

( * ) Notice: Subject to any disclaimer, the term of this patent is extended or adjusted under 35 U.S.C. 154(b) by 870 days.

(21) Appl. No.: 12/037,301

(22) Filed: Feb. 26, 2008

(65) Prior Publication Data

US 2008/0217656 A1    Sep. 11, 2008

(30) Foreign Application Priority Data

Mar. 8, 2007    (TW) ................. 96108077 A

(51) Int. Cl.
*H02H 9/00*    (2006.01)
(52) U.S. Cl. .................................................. 361/56
(58) Field of Classification Search .............. 361/56
See application file for complete search history.

(56) References Cited

U.S. PATENT DOCUMENTS

| 5,895,758 A | 4/1999 | Majnarich et al. |
| 6,867,461 B1* | 3/2005 | Ker et al. ............ 257/360 |
| 2008/0123228 A1* | 5/2008 | Hung .................... 361/56 |
| 2008/0217656 A1* | 9/2008 | Huang ................. 257/203 |
| 2009/0154035 A1* | 6/2009 | Galvano et al. ....... 361/56 |

FOREIGN PATENT DOCUMENTS

| TW | 535275 | 6/2003 |
| TW | 586266 | 5/2004 |

* cited by examiner

*Primary Examiner* — Ronald W Leja
(74) *Attorney, Agent, or Firm* — Kirton & McConkie; Evan R. Witt

(57) ABSTRACT

For ensuring the complete turn-off state of an ESD protecting device and preventing leakage current from a chip, an alternative conducting path is formed in the chip for bypassing an external current. The chip further includes an internal circuit and a conducting circuit.

18 Claims, 3 Drawing Sheets

I/O CIRCUIT WITH ESD PROTECTING FUNCTION

FIELD OF THE INVENTION

The present invention relates to an input/output circuit, and more particularly to an input/output circuit with an improved ESD protecting function.

BACKGROUND OF THE INVENTION

A chip generally outputs a signal generated thereby or receives a signal from an external circuit via an input/output port circuit disposed therein. Sometimes, electrostatic discharge (ESD) generated by the external circuit coupled to the chip may enter the chip via the I/O circuit as well. The electrostatic discharge may undesirably damage the chip or adversely affect the function of the chip.

Please refer to FIG. 1 which schematically illustrates an I/O circuit with ESD protecting means. As shown, an I/O circuit 10 is disposed in a chip 12 and coupled to an external circuit 14 and a driving voltage VPP. The I/O circuit 10 is an open drain I/O including a pull-down circuit 16 and a P-type transistor Mp for ESD protection. The source, gate and body of the P-type transistor Mp are electrically connected to the driving voltage VPP, and the drain is electrically connected to the pull-down circuit 16, an internal circuit 11 inside the chip 12 and the external circuit 14 via the node Nout.

Through the P-type transistor Mp, a current path can be formed between the driving voltage VPP and the external circuit 14. Therefore, the electrostatic current generated by the external circuit 14 can be bypassed to the driving voltage VPP via the current path and the chip 12 is protected from possible damage. On the other hand, for avoiding the effect of the P-type transistor Mp and/or the driving voltage VPP on the principal function of chip 12, the P-type transistor Mp should be always turned off. This object can be achieved by the architecture of FIG. 1 wherein the source and gate electrodes of the P-type transistor Mp is commonly coupled to the driving voltage VPP.

SUMMARY OF THE INVENTION

Therefore, the present invention provides an I/O port circuit exempting from current leakage occurring when the chip is in a power-down mode while the external circuit is in a power mode.

The present invention provides an input/output circuit for a chip. The input/output circuit includes: an electrostatic-discharge protecting device coupled to a driving voltage for providing a current path for bypassing an electrostatic current from an external circuit and protecting an internal circuit in the chip while the chip is operated in a power mode; and a conducting device coupled to the external circuit, the driving voltage and the electrostatic-discharge protecting device; wherein the conducting device ensures the electrostatic-discharge protecting device to be completely turned off while the chip is operated in a power down mode.

The present invention also provides an ESD protecting method of an input/output circuit in a chip. The method includes: providing a current path between an external circuit and the driving voltage for bypassing an electrostatic current from the external circuit and protecting an internal circuit in the chip while the chip is operated in a power mode; providing a conducting path coupled to the electrostatic-discharge bypass path between an external circuit and the driving voltage for bypassing the electrostatic current from the external circuit while the chip is operated in the power mode.

The present invention further provides an input/output circuit for a chip. The input/output circuit includes: an electrostatic-discharge protecting device coupled to a driving voltage for providing a current path for bypassing an electrostatic current from an external circuit and protecting an internal circuit in the chip while the chip is operated in a power mode; and a conducting device coupled to the external circuit, the driving voltage and the electrostatic-discharge protecting device for providing a conducting path and bypassing the electrostatic current while the chip is operated in a power down mode.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
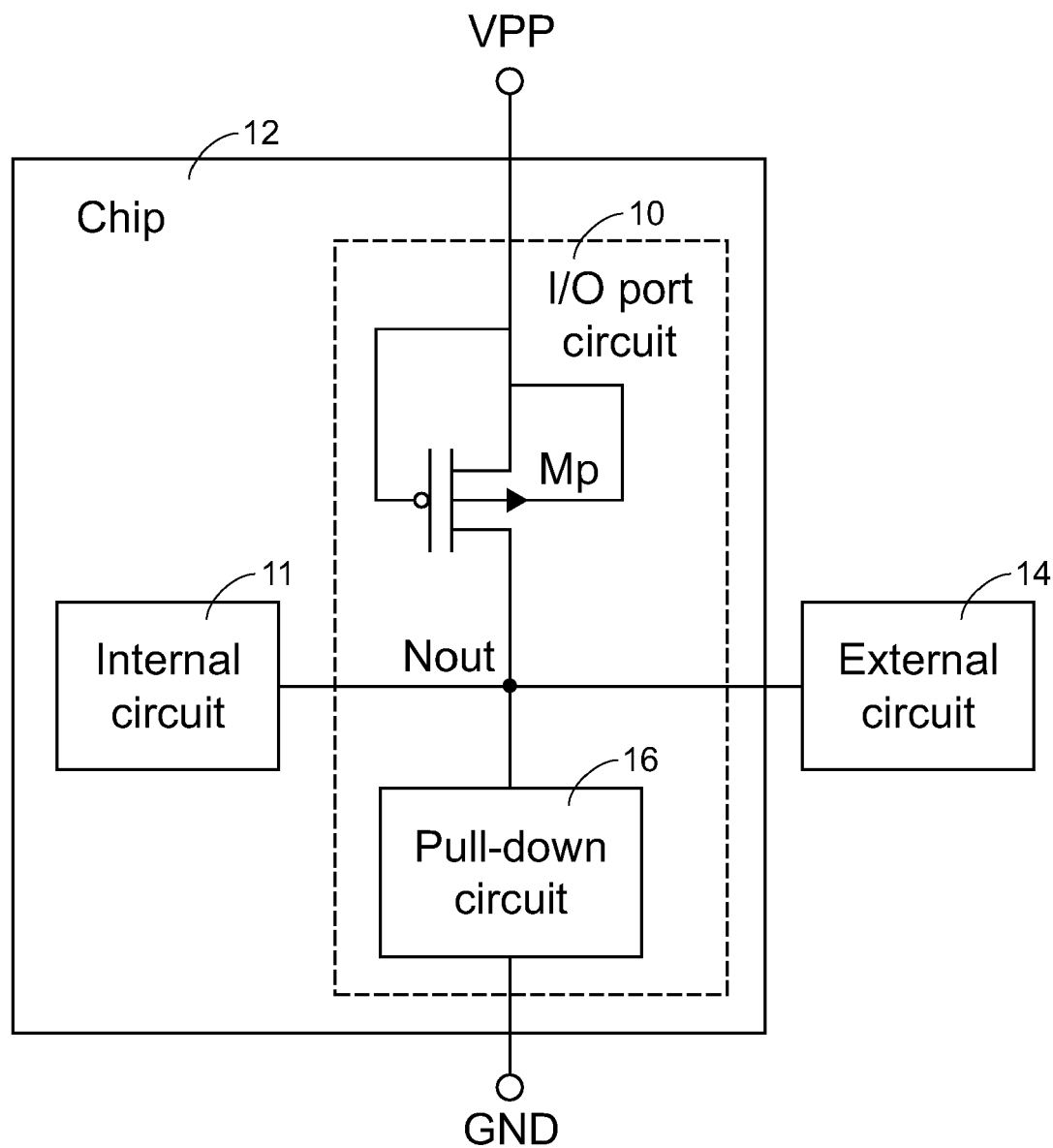
FIG. 1 is a functional block diagram of a conventional I/O circuit.

As mentioned above, an ESD protecting function can be imparted to an I/O circuit of a chip by providing an ESD bypass path from an external circuit to a driving voltage source so as to protect the chip from possible electrostatic discharge. However, while the chip is operated in a power down mode (i.e. the driving voltage VPP applied to the chip is at a low voltage level), the ESD device couldn't be completely turned off, and leakage current may occur due to a parasitic diode. For example, in FIG. 1, the P-N junction between the drain and substrate of Mp is conducted because the voltage at the node Nout, which is contributed by the external circuit 14, is higher than the driving voltage VPP.

Figure 2:
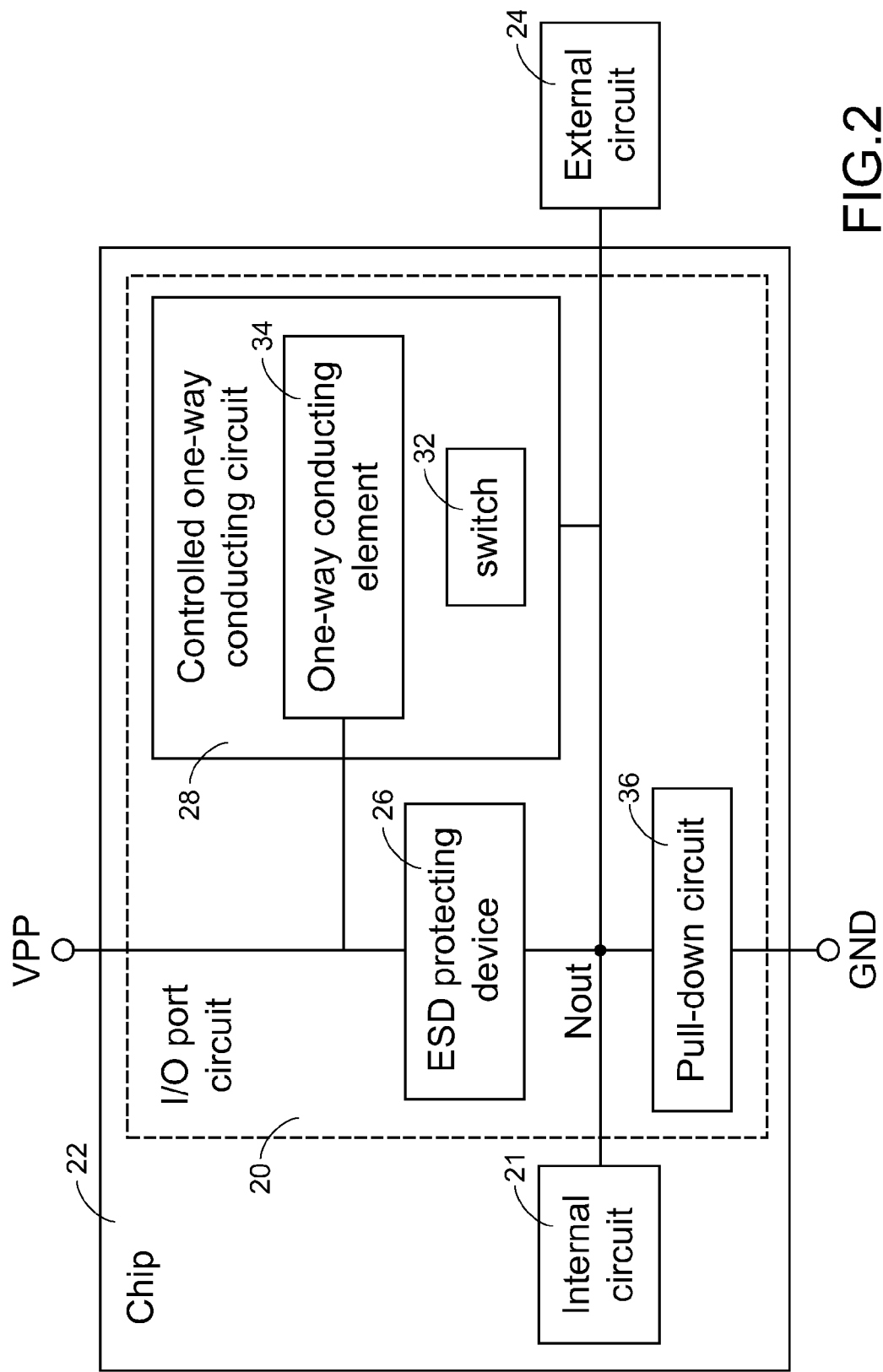
FIG. 2 is a functional block diagram schematically illustrating an I/O circuit according to an embodiment of the present invention.

The present invention provides solutions to make sure the ESD protecting device functions well and prevent leakage current as well. FIG. 2 schematically illustrates an input/output circuit according to an embodiment of the present invention.

The I/O circuit 20 as shown in FIG. 2 is an open drain I/O circuit disposed in a chip 22 and coupled to an internal circuit 21 inside the chip 22 and an external circuit 24 outside the chip 22. The I/O circuit 20, which is biased between a driving voltage VPP and a ground source GND, includes a pull-down circuit 36 and an electrostatic discharge (ESD) protecting device 26. As described above, the ESD protecting device 26 functions in the off state. The I/O circuit 20 further includes a conducting circuit 28 including a switch 32 and a one-way conducting element 34 is coupled between the external circuit 24 and the ESD protecting device 26. In the present invention, while the chip 22 is operated in a power down state, the conducting device 28 ensures the ESD protecting device 26 to be completely turned off by providing a conducting path to solve the problem of leakage current.

In the present invention, while the chip 22 is operated in a normal power mode (i.e. the driving voltage VPP applied to the chip 22 is at a high voltage level), the switch 32 is turned off, the one-way conducting element 34 doesn't work, and the ESD protecting device 26 functions normally. In other words, the ESD protecting device 26 forms a current path, so that the electrostatic current from the external circuit 14 can be bypassed to the driving voltage VPP via the current path.

On the other hand, while the chip 22 is operated in a power down mode (i.e. the driving voltage VPP applied to the chip 22 is at a low voltage level), the switch 32 is turned on and the conducting path is formed by the one-way conducting element 34. As a result, the electrostatic current from the external circuit 24 will be introduced to the driving voltage VPP through the one-way conducting element 34 without passing through the ESD protecting device 26. In other words, the one-way conducting element 34 ensures the ESD protecting device 26 to be turned off.

Figure 3:
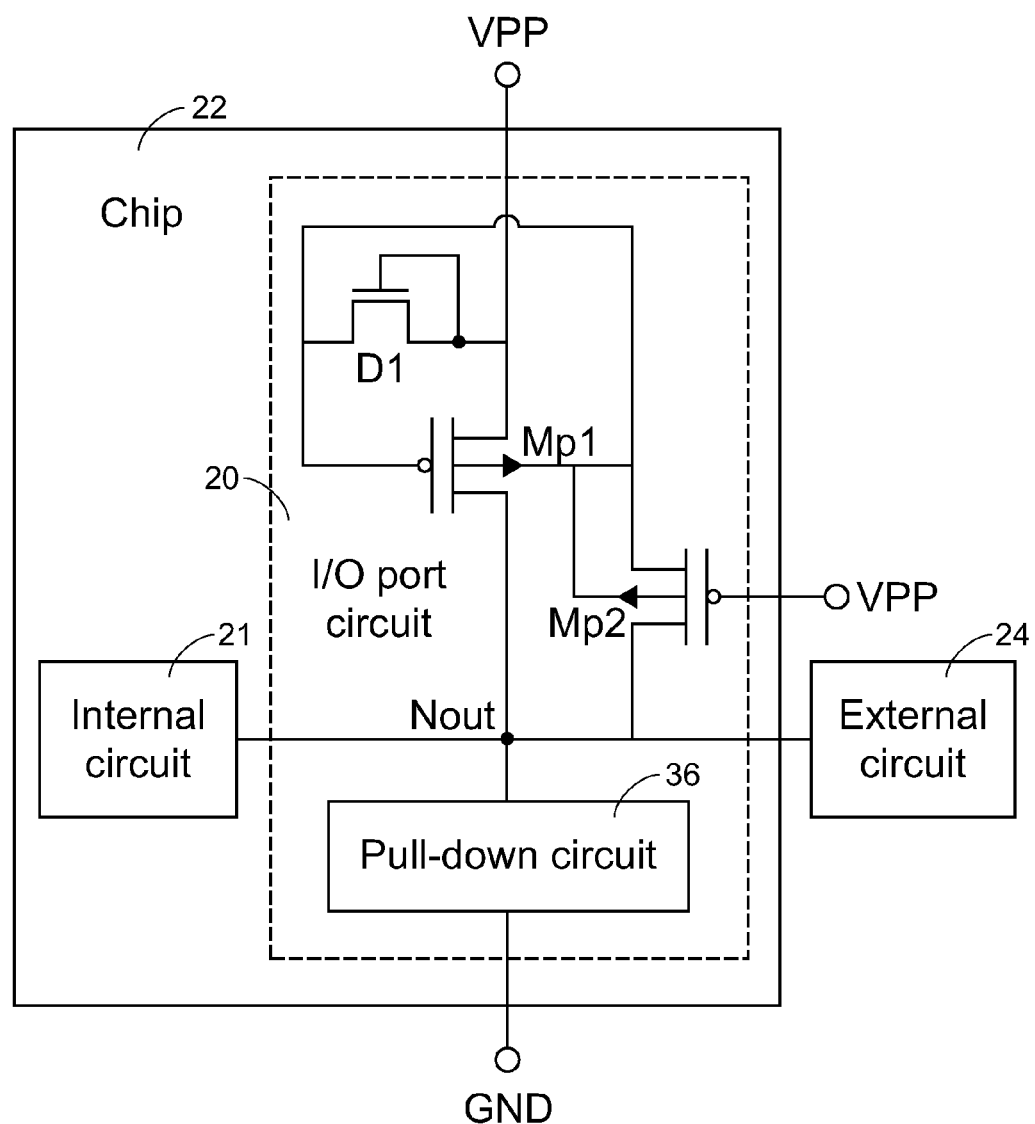
FIG. 3 is a partial circuit diagram showing an example of the I/O circuit of FIG. 2.

Further referring to FIG. 3, which exemplifies the circuitry of the ESD protecting device 26 and the conducting device 28. In this embodiment, the ESD protecting device 26 is implemented with a first PMOS Mp1, the switch is implemented with a second PMOS Mp2, and the one-way conducting element is implemented with a diode-connected NMOS D1. The gate of Mp2 is coupled to the driving voltage VPP. The substrates of Mp1 and Mp2 are interconnected and further coupled to the gate of the first P-type transistor Mp1. The drain of Mp2 is coupled to a first end of D1 to form a floating N-well net. A second end of D1 is coupled between the driving voltage VPP and the drain of Mp1.

While the chip 22 is operated in a power mode, the second P-type transistor Mp2 is turned off, D1 doesn't work and Mp1 functions normally. On the other hand, while the chip 22 is operated in a power down mode, the driving voltage VPP is at a low voltage level, Mp2 is turned on, and the floating N-well net follows the voltage at the node Nout, and the first P-type transistor Mp1 is still turned off; therefore, the problem of leakage current is prevented.

It is realized from the above descriptions that no matter whether the chip 42 is in a power mode or a power-down mode and how the voltage at the I/O end varies, the first P-type transistor Mp1 is always kept perfectly OFF according to the present invention. Therefore, leakage current can be prevented.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An input/output circuit of a chip, comprising:
   an electrostatic-discharge protecting device coupled to a driving voltage for providing a current path for bypassing an electrostatic current from an external circuit and protecting an internal circuit in the chip while the chip is operated in a power mode; and
   a conducting device coupled to the external circuit, the driving voltage and the electrostatic-discharge protecting device; wherein the conducting device ensures the electrostatic-discharge protecting device to be completely turned off while the chip is operated in a power down mode.

2. The input/output circuit of claim 1 further comprising a pull-down circuit coupled to the external circuit, the internal circuit and the electrostatic-discharge protecting device.

3. The input/output circuit of claim 1 wherein the conducting device includes:
   a switch coupled to the external circuit and the driving voltage; and
   a one-way conducting element coupled between the electrostatic-discharge protecting device and the switch for ensuring the electrostatic-discharge protecting device to be completely turned off;
   wherein while the chip is operated in the power mode, the switch is turned off and the one-way conducting element does not work; and while the chip is operated in the power down mode, the switch is turned on so that a conducting path is formed by the one-way conducting element for passing the electrostatic current, and the electrostatic-discharge protecting device is turned off.

4. The input/output circuit of claim 3 wherein the chip is operated in the power mode while the driving voltage is at a high voltage level and operated in a power down mode while the driving voltage is at a low voltage level.

5. The input/output circuit of claim 3 wherein the electrostatic-discharge protecting device is implemented with a first PMOS, the switch is implemented with a second PMOS, and the one-way conducting element is implemented with a diode-connected NMOS.

6. The input/output circuit of claim 5 wherein the substrate of the first PMOS and the second PMOS are interconnected and further coupled to the gate of the first PMOS, the drain of the second PMOS and a first end of the diode-connected NMOS; and a second end of the diode-connected NMOS is coupled between the driving voltage and the drain of the first PMOS.

7. The input/output circuit of claim 1 wherein the electrostatic-discharge protecting device is turned off in both the power mode and the power down mode.

8. An ESD protecting method of an input/output circuit of a chip, the chip being biased by a driving voltage, the chip comprising an electrostatic-discharge protecting device, and the method comprising:
   providing a current path between an external circuit and the driving voltage for bypassing an electrostatic current from the external circuit and protecting an internal circuit in the chip while the chip is operated in a power mode;
   providing a conducting path coupled to the electrostatic-discharge bypass path between an external circuit and the driving voltage for bypassing the electrostatic current from the external circuit while the chip is operated in a power down mode; and
   turning off the electrostatic-discharge protecting device under both the power mode and the power down mode.

9. The operating method of claim 8 wherein the chip is operated in the power mode while the driving voltage is at a high voltage level.

10. The operating method of claim 8 wherein the chip is operated in a power down mode while the driving voltage is at a low voltage level.

11. An input/output circuit of a chip, comprising:
    an electrostatic-discharge protecting device coupled to a driving voltage for providing a current path for bypassing an electrostatic current from an external circuit and protecting an internal circuit in the chip while the chip is operated in a power mode; and a conducting device coupled to the external circuit, the driving voltage and the electrostatic-discharge protecting device for providing a conducting path and bypassing the electrostatic current while the chip is operated in a power down mode.

12. The input/output circuit of claim 11 further comprising a pull-down circuit coupled to the external circuit, the internal circuit and the electrostatic-discharge protecting device.

13. The input/output circuit of claim 11 wherein the conducting device includes:
   a switch coupled to the external circuit and the driving voltage; and
   a one-way conducting element coupled between the electrostatic-discharge protecting device and the switch for providing the conducting path.

14. The input/output circuit of claim 13 wherein the switch is turned off while the chip is operated in the power mode; and the switch is turned on while the chip is operated in the power down mode.

15. The input/output circuit of claim 13 wherein the chip is operated in the power mode while the driving voltage is at a high voltage level and operated in the power down mode while the driving voltage is at a low voltage level.

16. The input/output circuit of claim 13 wherein the electrostatic-discharge protecting device is turned off while the conducting path is formed.

17. The input/output circuit of claim 13 wherein the electrostatic-discharge protecting device is implemented with a first PMOS, the switch is implemented with a second PMOS, and the one-way conducting element is implemented with a diode-connected NMOS.

18. The input/output circuit of claim 17 wherein the substrate of the first PMOS and the second PMOS are interconnected and further coupled to the gate of the first PMOS, the drain of the second PMOS and a first end of the diode-connected NMOS; and a second end of the diode-connected NMOS is coupled between the driving voltage and the drain of the first PMOS.

* * * * *